United States Patent Office 3,782,951

Patented Jan. 1, 1974

3,782,951

PHOTOPOLYMERIZABLE COMPOSITIONS CAPABLE OF YIELDING REVERSE IMAGES

Shung-Yan Lee, Wilmington, Del., assignor to E. I. du Pont de Nemours and Company, Wilmington, Del.

No Drawing. Filed July 31, 1972, Ser. No. 276,381

Int. Cl. G03c *1/94*

U.S. Cl. 96—86 P 6 Claims

ABSTRACT OF THE DISCLOSURE

Photopolymerizable compositions are described containing an ethylenically unsaturated monomer, an organic polymeric binder and, as the initiator system, a hexaarylbiimidazole and a hydrogen-donor compound. These inventive compositions are capable of yielding reverse photopolymer images since relatively intense radiation prevents polymerization, while less intense radiation yields photopolymerization. The first (intense) exposure is imagewise and the second (less intense) exposure is non-imagewise. The compositions are useful in the graphic arts where a positive-working system is required, e.g., for relief or planographic printing plates, direct positive copying films, and the like.

BACKGROUND OF THE INVENTION

Field of the invention

This invention pertains to photopolymerizable compositions, elements, and processes of photopolymerization. More particularly, it pertains to such compositions, elements and processes that yield a reverse image in a photosensitive layer by a photohardening or photopolymerizing step.

Description of the prior art

Photosensitive compositions that undergo hardening by photo-induced polymerization and/or cross-linking are well known in the prior art. For example, U.S. 3,479,185, issued Nov. 18, 1969, discloses photopolymerizable compositions containing a polymerizable monomer, a hydrogen or electron donor, a hexaarylbiimidazole initiator, and a polymeric binder. When such compositions are used as the photosensitive elements, they provide a system that is "negative working" in the customary sense of that term in the art. That is, the areas of the layer that are exposed (e.g., through the transparent portions of a process transparency) are photohardened, whereas the complementary, adjoining areas of the layer (e.g., those masked by the opaque portions of the transparency) are relatively unchanged and are generally removed by such procedures as solvent washout or thermal transfer. The image formed in the photohardenable layer is thus an inversion or reciprocal of the original, i.e., a negative original will produce a positive image in the photohardenable layer and vice versa. It is, of course, possible to produce "positive working" final copies from such systems by such means as the thermal transfer processes described in U.S. Pats. 3,060,023, 3,060,024, and 3,060,025 wherein the underexposed (i.e., non-photohardened) portion of the layer is transferred to a separate receptor sheet, or by non-thermal separation of the underexposed portion on an integral receptor sheet as described in U.S. Pat. 3,353,955. However, insofar as the image originally produced in the photohardenable layer is concerned, these are still negative-working systems.

There frequently exists in the graphic arts a need to circumvent the inversion or series of inversions inherent in the negative-working systems just described. It may be desired, for example, to make a positive printing plate from a positive original without going through the step of making a negative, or it may be desired to make a positive thermal transfer copy when only a negative original is available. To meet these requirements, there is needed a "positive working" or "reverse image" system, wherein the image produced in the photosensitive layer is a true copy rather than an inversion of the original. Reversal processes are known, of course, in silver halide photography by several methods, including the bleach/re-expose technique and transfer diffusion procedures.

In the context of photohardenable or photopolymerizable systems, a "reverse image" in the photosensitive layer is one in which the areas of the layer corresponding to the dark or opaque areas of the original (e.g., a process transparency) are photohardened while the areas corresponding to the light or transparent areas of the original are not substantially photohardened. Insofar as the image formed in the photosensitive layer is concerned, a "reverse image" of this kind provides a positive-working system. For example, the non-photohardened material can be removed by such means as solvent wash-out, to leave as a relief the photohardened material that corresponds to the dark or opaque areas of the original, and the so-developed layer can be used as either a relief or planographic printing plate to print true copies of the original. Alternatively, by such procedures as thermal transfer and subsequent toning of the non-photohardened areas that correspond to the light or transparent areas of the original, the final copies will be negative-working with respect to the original. However, in this latter case it remains true that the photohardened image formed in the photosensitive layer is a "reverse" image that is positive-working with respect to the original.

A reverse-image process employing photohardenable compositions in the photosensitive layer is described in U.S. Pat. 3,380,825. The process involves a first imagewise exposure under such conditions that a gaseous polymerization inhibitor exhausts the photoinitator that has been excited by actinic radiation in the exposed areas without any substantial polymerization having occurred. The photosensitive layer is then shielded from the gaseous inhibitor during a second, nonimagewise exposure to the same actinic radiation. Thus, polymerization can occur only in those areas where the photoinitiator was not exhausted in the first, imagewise exposure; i.e., polymerization or hardening occurs in the areas that correspond to the dark or opaque areas of the original, and a "reverse" image that is a true copy of the original is produced in the photosensitive layer. When carefully carried out, the process of the patent is capable of producing reverse images of excellent quality, but the process involves careful and inconvenient manipulations that affect its practicality and economic attractiveness. Foremost among these is the necessity to interrupt the process to preclude the presence of the gaseous inhibitor during the second, non-imagewise exposure step. This is usually accomplished by overlaying the photosensitive element with a sheet of film that is transparent to the actinic radiation employed but impervious to the gaseous inhibitor. If this step is not carefully performed, final image quality will suffer because the desired polymerization will not occur at all or will occur erratically in the second exposure step because of the presence of non-excluded inhibitor. The requirement to interrupt the process for the careful installation of the barrier layer naturally adds to the cost of the copies made by the process. The need exists, therefore, for a simpler, more certain and less expensive approach to making reverse images in photosensitive layers or elements employing photohardenable or photopolymerizable compositions. Various approaches to this end are illustrated in U.S. 3,556,794, issued Jan. 19, 1971, U.S. 3,615,454, issued Nov. 26, 1971, and in U.S. Ser. No. 189,835, filed Nov. 18, 1971, each having unique characteristics and requirements differing markedly from the present invention.

It is an object of the present invention to provide a reverse image system alternative to those of the prior art, which yields a reverse image in a photopolymerizable layer upon varying the intensity of the exposure. It is a further objective to provide such a system having a single photoinitiating system, responsive to light of a single wavelength, not requiring an external source of polymerization inhibitor, and capable of being permanently desensitized. These and other objectives, which will be apparent to those skilled in the art, are achieved using the compositions and processes of the invention. It has been found that these objectives can be achieved in accordance with the invention by merely employing conventional components of hexaarylbiimidazole-initiated photopolymerizable systems in certain critical amounts, as described more fully hereinafter.

SUMMARY OF THE INVENTION

In a photosensitive compositive consisting essentially of:

(A) a hydrogen- or electron-donor compound,
(B) a hexaarylbiimidazole,
(C) an ethylenically unsaturated compound capable of forming a high polymer by free radical initiated, chain propagating, addition polymerization,
(D) an organic polymeric binder, the improvement wherein the concentrations of the components are, by weight, less than 0.4% (A), at least 1% (B), 30–70% (C), and 68–28% (D), with the ratio of (B)/(A) being 10/1 or greater, said composition being capable of yielding reverse images by photopolymerization.

High intensity exposure of the above-described composition destroys polymerizability without polymerization taking place, while medium or low intensity exposure yields polymerization. The invention, therefore, includes the process of imagewise exposing the composition to radiation which destroys polymerizability of the composition in the exposed areas and subsequently exposing the entire composition to radiation which induces photopolymerization in the previously unexposed areas.

Photosensitive elements comprising a support bearing a layer or coating of the composition are included in the invention.

DESCRIPTION OF THE PREFERRED EMPODIMENTS

This invention is based upon the surprising discovery that photopolymerizable systems, initiated by a hexaarylbiimidazole/hydrogen-donor compound combination, which are known to induce rapid and efficient negative-working photopolymer systems, can also yield positive-working systems. Critical to this discovery is the importance of the ingredients' concentration, particularly with regard to hydrogen-donor compound and hexaarylbiimidazole. Thus, within the critical concentration range, a reverse imaging system is available. Outside this range, the standard negative working system is obtained, as known in prior art. The surprising behavior of the composition of the invention might be explained by an overabundance of triarylimidazole radicals, which are formed when the hexaarylbiimidazole dissociates, which destroy or react with the relatively low concentration of hydrogen- or electron-donor compound when generated rapidly by high intensity exposure. The invention is to be in no way limited by this theoretical explanation, however.

Consistent with the explanation that the hydrogen- or electron-donor is deactivated or destroyed, is the fact that areas exposed to high intensity radiation cannot be subsequently photopolymerized no matter what intensity irradiation source is subsequently used. Due to the non-image areas being unpolymerized, as just described, mechanical or chemical processes of toning, solvent wash-out of the unpolymerized areas, transfer, and the like, are permissible with compositions and elements of the invention.

The composition of the invention is usually employed in a photosensitive element as a coating or layer on a substrate such as a metal sheet, paper, or polymeric film, and is normally covered by a strippable cover sheet (e.g., polyethylene terephthalate film). In a preferred embodiment the element bears a photopolymerizable stratum containing 0.01–0.06% hydrogen donor, preferably a leuco dye, (A), 4–9% hexaarylbiimidazole (B), 38–50% monomer (C), and 53–38% binder (D) in an intimate mixture. The stratum may also contain small amounts (e.g., less than 1%) of a dye for convenience in locating the presence and position of the photopolymerized zones following exposure and wash-out.

The components (A) Hydrogen- or electron-donor compound: The hydrogen-donor component of the composition is a compound which has a reactive atom, usually hydrogen, which is removable to yield a radical that will react with the ethylenically unsaturated monomer to initiate growth of polymer chains, or with the ethylenically unsaturated polymeric compound to initiate crosslinking. Some of these materials are also sometimes referred to as electron-donor agents. In the practice of the present invention, it is important that the hydrogen-donor compound should not itself be activatable by actinic radiation to produce free-radicals that will initiate polymerization, but that it be reactive with the free-radical-producing agent (hexaarylbiimidazole) that is responsive to actinic radiation.

Particularly useful and preferred hydrogen-donor compounds are described in Thomas and Walker U.S. Pat. 3,418,118 and in Chambers U.S. Pat. 3,479,185. Among the suitable classes of compounds are amines, including secondary and tertiary amines, and especially the aromatic tertiary amines having at least one $CH_2$ group adjacent to the nitrogen atom; amine-substituted leuco dyes, especially those having at least one dialkylamino group; and leuco triphenylamine dyes or various salts (e.g., HCl salts) thereof. Representative materials include leuco Crystal Violet, tris-(4-diethylamino-o-tolyl) methane, rhodanine (2-mercapto-4-hydroxythiazole), 5-(p-dimethylaminobenzylidine)-rhodanine, as well as the extensive lists of specific compounds that appear in the two patents cited.

(B) The hexaarylbiimidazole: These are 2,2′,4,4′,5,5′-hexaarylbiimidazoles, sometimes called 2,4,5-triarylimidazolyl dimers, or lophine dimers, which are photodissociable to the corresponding triarylimidazolyl radicals. These hexaarylbiimidazoles absorb maximally in the 255–275 nm. region, and usually show some, though lesser, absorption in the 300–375 nm. region. Although the absorption bands tend to tail out to include wavelengths as high as about 420 nm., they thus normally require light rich in the 255–375 nm. wavelengths for their dissociation.

The hexaarylbiimidazoles can be represented by the formula

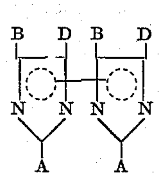

wherein A, B, and D represent aryl groups which can be the same or different, carbocyclic or heterocyclic, unsubstituted or substituted with substituents that do not interefere with the dissociation of the hexaarylbiimidazole to the triarylimidazolyl radical, and each dotted circle stands for four delocalized electrons (i.e., two conjugated double bonds) which satisfy the valences of the carbon and nitrogen atoms of the imidazolyl ring.

The aryl groups include one- and two-ring aryls, such as phenyl, biphenyl, naphthyl, furyl and thienyl. Suitable inert substituents on the aryl groups have Hammett sigma (para) values in the −.5 to 0.8 range and are other than hydroxyl, sulfhydryl, amino, alkylamino or dialkylamino. Preferably they are free of Zerewitinoff hydrogen, i.e., have no hydrogens reactive towards methyl magnesium iodide. Representative substituents and their sigma values (relative to H=.00), as given by Jaffe, Chem. Rev. 53, 219–233 (1953) are: methyl (−0.17), ethyl (−0.15), t-butyl (−0.20), phenyl (0.01), trifluoromethyl (0.55), chloromethyl (0.18), cyanomethyl (0.01), 2-carboxy-ethyl (−0.07), butoxy (−0.32), phenoxy (−0.03), fluoro (0.06), chloro (0.23), bromo (0.23), iodo (0.28), methylthio (−0.05), methylsulfonyl (0.73), nitro (0.78), ethoxycarbonyl (0.52), cyano (0.63), and carboxyl (0.27). Thus, the substituents may be halogen, cyano, lower hydrocarbyl (including alkyl, halo alkyl, hydroxyalkyl, cyanoalkyl, and aryl), alkoxyl, aryloxy, alkylthio, arylthio, sulfo, alkyl sulfonyl, aryl-sulfonyl, and nitro. In the foregoing list, alkyl groups referred to therein are preferably of 1–6 carbon atoms; while aryl groups referred to therein are preferably of 6–10 carbon atoms.

Normally the B and D groups can carry 0–3 substituents and the A ring 0–4 substituents.

Preferably the aryl radicals are carbocyclic, particularly phenyl, and the substituents have Hammett sigma values in the range −.4 to +.4, particularly lower alkyl, lower alkoxy, Cl, F and Br groups.

In a preferred biimidazole class, the 2 and 2′ aryl groups are phenyl rings bearing an ortho substituent having a Hammett sigma value in the range −.4 to +.4. Preferred such ortho substituents are fluorine, chlorine, bromine, lower alkyl and alkoxy groups; especially chloro.

Most preferably, the 2-phenyl ring carries only the above-described ortho group, and the 4- and 5-phenyl rings are either unsubstituted or substituted with lower alkoxy.

Specific examples of the foregoing hexaarylbiimidazoles are disclosed in U.S. Pat. 3,445,234 and British Pat. 997,396. The portions of said patents pertinent to the biimidazole disclosure recited are incorporated herein by reference.

(C) The monomer: The instant invention is not limited to the use of any particular polymerizable monomer, it being required only that the monomer be ethylenically unsaturated and capable of addition polymerization. A large number of useful compounds is available, generally characterized by a plurality of terminal ethylenic groups. Among the suitable materials may be mentioned (a) various vinyl and vinylidene monomers, e.g., vinyl carboxylates, α-alkyl acrylates, α-substituted acrylic acids and esters thereof, vinyl esters, vinyl hydrocarbons, acrylic and α-substituted acrylic acid esters of the polymethylene glycols and ether alcohols, all as disclosed in Plambeck, U.S. Pats. 2,760,863 and 2,791,504; (b) the various compounds disclosed (col. 16, ll. 36 ff.) in Martin and Barney, U.S. Pat. 2,927,022, and especially those having a plurality of addition-polymerizable ethylenic linkages, particularly when present as terminal linkages, and more especially those wherein at least one and preferably most of such linkages are conjugated with a doubly bonded carbon, including carbon doubly bonded to carbon or to such heteroatoms as nitrogen, oxygen and sulfur; (c) esters of pentaerythritol compounds of the kind disclosed in Celeste and Bauer, U.S. Pat. 3,261,686; and (d) compounds of the kind described in Cohen and Schoenthaler, U.S. Pat. 3,380,831, e.g., the reaction product of trimethylolpropane, ethylene oxide, and acrylic and methacrylic acids.

The polymeric binder and the polymerizable monomer can be combined in a single material serving both of these functions, in which case the required ethylenic unsaturation can be present as an extralinear substituent attached to a thermoplastic linear polymer, e.g., polyvinyl acetate/acrylate, cellulose acetate/acrylate, cellulose acetate/methacrylate, N-acrylyloxymethyl polyamide, and the like. Suitable materials of this kind are described, for example, in U.S. Pats. 3,418,295 and 3,448,089. For convenience in expression herein, the term "polymerizable monomer" is to be understood as including ethylenically unsaturated, photo-crosslinkable polymeric compounds of this kind, and the term "polymerization" include crosslinking.

Many of the low molecular weight polymerizable components discussed previously, including both the mono- and polyethylenically unsaturated compounds, will normally contain, as obtained commercially, minor amounts (about 50–100 parts per million by weight) of polymerization inhibitors to prevent spontaneous thermally induced polymerization before desired. The presence of these inhibitors, which are usually of the antioxidant type, in such amounts causes no undesirable results in the practice of this invention, either as to speed or as to quality of polymerization. Among the suitable thermal polymerization inhibitors are p-methoxyphenol, hydroquinone, alkyl- and aryl-substituted quinones and hydroquinones, tert-butyl catechol, pyrogallol, copper resinate, naphthylamines, β-naphthol, cuprous chloride, 2,6-di-tert-butyl-p-cresol, phenothiazine, pyridine, nitrobenzene and dinitrobenzene, p-toluquinone, chloranil, and thiazine dyes, e.g., Thionine Blue G (C.I. 52025), Methylene Blue B (C.I. 52015), and Toluidene Blue O (C.I. 52040).

(D) The Binder: The binder used is an organic polymeric material that is preferably solid at 50° C., and it is necessary that the binder be compatible with the polymerizable monomer and the polymerization initiator system. It may frequently be desirable, but it is not required, that the binder be thermoplastic. The binder may be of the same general type as the polymerizable monomer being used and may be soluble therein and plasticized thereby.

A wide variety of suitable binders, both thermoplastic and nonthermoplastic, is disclosed in Burg and Cohen, U.S. Pat. 3,060,023, e.g., cellulose ethers or esters; polyalkylene ethers; condensation polymers of glycols with dibasic acids; polymers and copolymers of vinyl esters; acrylic acids and esters; polyvinyl alcohol; cellulose; phenolic resins; and the like. Other binders, including a number of vinylidene polymers, are disclosed in Plambeck, U.S. Pats. 2,760,863 and 2,791,504. Still other useful binders are (a) the N-methoxymethyl polyhexamethylene adipamide mixtures of Saner, British Pat. 826,272; (b) the polyester, polyacetal or mixed polyesteracetal mixtures of Martin, U.S. Pat. 2,892,716; (c) the fusible polyvinyl alcohol derivatives of Martin, U.S. Pat. 2,902,365; (d) the fusible blends of selected organic-soluble, base-soluble cellulose derivatives of Martin and Barney, U.S. Pat. 2,927,022; (e) the polyvinyl acetal compositions having extralinear vinylidene groups of Martin, U.S. Pat. 2,902,710; (f) the linear polyamide compositions containing extralinear N-acrylyloxymethyl groups of Saner and Burg, U.S. Pat. 2,972,540; and (g) the 1,3-butadiene compositions of McGraw, U.S. Pat. 3,024,180.

For use according to the invention, by appropriate selection of the kind and proportion of binder, the preferred components outlined above may be mixed together in a suitable solvent and the resulting composition cast by conventional procedures to form, after evaporation of the solvent, a self-supporting photosensitive stratum. Alternatively, the solution of components may be coated on a base or substrate and the solvent then evaporated to leave a photosensitive stratum on the base. As a matter of convenience in handling, it is generally preferred to employ a base or substrate.

Optional component

Small quantities of a dye may be present in the composition. This optional component is essentially for visibility purposes, i.e., to aid the user to locate the position and presence of the residual polymerized portion, after the unpolymerized zone has been removed. The dye incorporated preferably should not absorb excessive amounts of radiation at the exposure wavelength or inhibit the polymerization or desensitizing reactions.

Among the dyes useful in the invention are Fuchsine (C.I. 42510), Auramine Base (C.I. 41000B), Calcocid Green S (C.I. 44090), Para Magenta (C.I. 42500), Tryparosan (C.I. 42505), New Magenta (C.I. 42520), Acid Violet RRL (C.I. 42425), Red Violet 5RS (C.I. 42690), Nile Blue 2B (C.I. 51185), New Methylene Blue GG (C.I. 51195), C. I. Basic Blue 20 (C.I. 42585), Iodine Green (C.I. 42556), Night Green B (C.I. 42115), C.I. Direct Yellow 9 (C.I. 19540), C.I. Acid Yellow 17 (C.I. 18965), C.I. Acid Yellow 29 (C.I. 18900), Tartrazine (C.I. 19140), Supramine Yellow G (C.I. 19300), Buffalo Black 10B (C.I. 27790), Naphthalene Black 12R (C.I. 20350), Fast Black L (C.I. 51215), Ethyl Violet (C.I. 20350), Ethyl Violet (C.I. 42600), and Solvent Red (C.I. 109).

Preparation of elements

As previously indicated, the several components of the photosensitive compositions will ordinarily be mixed together in a material that is a solvent for all of the components. The particular solvent used is not critical; it merely affords a practical method of obtaining coatings or self-supporting films of the compositions. Representative of solvents that may be used, but in no way limiting, are 2-propanone, 2-butanone, 2-pentanone, 1,2-dichloroethane, methyl acetate, dichloromethane, trichloromethane, and ethyl acetate.

For convenience in handling, the photopolymerizable composition is preferably coated on a base support. Suitable materials include films composed of high polymers such as polyamides, e.g., polyhexamethylene sebacamide, polyhexamethylene adipamide; polyolefins, e.g., polypropylene; polyesters, e.g., polyethylene terephthalate, polyethylene terephthalate/isophthalate; vinyl polymers, e.g., vinyl acetals, vinylidene chloride/vinyl chloride copolymers, polystyrene, polyacrylonitrile; and cellulosics, e.g., cellulose acetate, cellulose acetate/butyrate, cellophane. A particularly preferred support material is polyethylene terephthalate film of the kind described in Alles et al., U.S. Pat. 2,627,088, and Alles, U.S. Pat. 2,779,684, with or without the surface coating described in the former patent. Where the particular application does not require that the base support be transparent, the photopolymerizable composition may usefully be coated on an opaque support, such as paper, especially water-proof photographic paper; thin metal sheets, especially aluminum and copper sheets (e.g., the strippable supports for photoresists as described by Celeste in U.S. Pat. 3,469,982); cardboard; and the like. The support used, of whatever type, may also have in or on its surface and beneath the photopolymerizable stratum an antihalation layer or other substrate needed to facilitate anchorage of the photopolymerizable stratum to the base. The manner of coating the photosensitive composition on a base or of casting it to form a self-supporting film is not critical; these operations are readily performed by procedures well known to those skilled in the art.

Even after evaporation of the solvent, many of the photosensitive coatings or self-supporting films made from the various components outlined above are somewhat soft, sticky, or tacky. To facilitate storage and handling, it may frequently be desirable to apply a cover layer, which may be either an additional coating or a previously cast film. A convenient and suitable material is any of the several commercially available varieties of polypropylene film. Alternatively, any of a number of readily soluble polymeric materials, e.g., cellulose acetate, may be coated in solution over the photosensitive stratum to leave, after removal of solvent, a hard, dry, non-tacky surface. Depending on the degree of tackiness of the photosensitive stratum, the protective layer may be left in place during exposure or not, as desired. If it is to be left in place, the material selected should have good clarity.

Component proportions and ratios

The component's concentrations and ratios are critical in this invention. The hydrogen-donor is restricted to very low concentrations, comprising less than 0.4% (by weight) of the dried photosensitive composition, preferably between 0.01–0.06%. When the hydrogen-donor compound's concentration is greater than that specified above, the system is strictly negative-working as known in the art. Furthermore, the operable range is so low that care must be used in excluding impurities which could serve as hydrogen-donor compounds. This involves, for example, avoiding the use of supports or cover sheets from which a hydrogen-donor compound could migrate, good quality control during preparation, and the like.

The concentration of the hexaarylbiimidazole is also critical for obtaining reversal. This component must be present in relatively high concentrations, i.e., at least 1–2%, preferably from 4–9%. Moreover, the two components of the polymerization initiating system, the hexaarylbiimidazole and hydrogen-donor compound, must be present in a concentration ratio (by weight) of at least 10/1; in preferred formulations this ratio is approximately 250/1. Again, operating below this limit results in a standard, negative-working, photosensitive composition.

The upper limit of the hexaarylbiimidazole concentration, and the upper limit of its ratio to hydrogen-donor agent, is not critical. However, a concentration range of 4–9% is preferred. The monomer and binder concentrations are much more flexible than the preceding two components; they are selected to yield a proper internal viscosity to the photosensitive composition. Although the internal viscosity of a photosensitive layer is not readily measured, it depends upon the viscosities of the major ingredients added, which are the monomer and binder in the inventive compositions. Thus, it has been found that photopolymerizable compositions amenable to reversal contain between 30–70% monomer and reciprocally between 28–68% binder. Moreover, within the above concentration ranges, the viscosity of the monomer is important. For example, if the monomer has a high viscosity, a high percentage of monomer (e.g., 60%, if monomer has viscosity of 150 cps.), is needed for reversal to occur. Conversely, with monomers of low viscosity (e.g., 11.5 cps.), low concentrations are effective (e.g., 40%).

The process

In carrying out the process of this invention, a photosensitive layer is prepared as already described. The layer will include a polymeric binder, an ethylenically unsaturated monomer, a hydrogen-donor compound, and a hexaarylbiimidazole. The layer is given a first imagewise exposure, e.g., through a process transparency by conventional contact-printing or projection techniques, to actinic radiation of wavelength and intensity suitable to photodissociate the hexaarylbiimidazole to triarylimidazolyl radicals which may destroy or deactivate the hydrogen-donor compound, thereby preventing photopolymerization. The light source should supply radiation in the ultraviolet region, between 200 nm. and 420 nm. Such sources include carbon arcs, mercury vapor arcs, fluorescent lamps with ultraviolet radiation emitting phosphors, argon glow lamps, electronic flash units and photographic flood lamps. In general, the intensity should be greater than 1 milliwatt per square centimeter of exposed area (equivalent to 1 millijoule/sec.-cm.$^2$), and preferably greater than 5 mw./cm.$^2$. Exposure times may vary from a fraction of a second to many minutes, e.g. $10^{-3}$ to $10^3$ seconds, with longer times generally unnecessary. The total imagewise exposure is normally between 5 and 1000 mj./cm.$^2$, more usually between 25 and 100 mj./cm.$^2$. Under these conditions, the hydrogen-donor compound in the exposed areas is exhausted without any substantial amount of polymerization having occurred.

The layer is then given an overall, nonimagewise exposure to actinic ultraviolet radiation suitable to initiate polymerization of the monomer in all the areas not exposed in the first, imagewise exposure step. The areas exposed in the first step will not polymerize because the hydrogen-donor compound in those areas was exhausted during the first exposure step. Thus, the polymerized image formed in the layer is a reverse image that is a true copy of the original, because the areas finally polymerized are those not exposed in the first, imagewise exposure, i.e., those that correspond to the dark or opaque areas of the original.

This second exposure step, which induces photopolymerization, is known in the art. The intensity is usually less than 10 mj./cm.$^2$, often between about 1 and 5 mj./cm.$^2$.

As described herein this invention is dependent upon five variables, namely the concentrations of hydrogen-donor compounds, hexaarylbiimidazole, monomer and binder, and the intensity of exposure. Within any system dependent upon this many variables, some selection, and caution, is necessary to obtain the results of the invention (e.g., selecting the optimum monomer concentration on the basis of its viscosity).

Thus, this invention has been described in its broadest aspects. Optimum conditions for any particular formulation are easily determined by trial in accord with the principles discussed herein. For example, an optimum system can be achieved by varying any one of the five variables, provided the other four are fixed within the ranges specified.

Utility

Upon completing the two exposures the image in the layer can be developed in any of a number of ways known in the art. These techniques include solvent wash-out of unpolymerized material, thermal transfer of the unpolymerized portions to a receptor sheet, dusting or toning with dyes or pigments that adhere to the tacky unpolymerized areas but not to the photohardened areas, differential adhesion of unpolymerized and photohardened areas, diffusion of dyes into or through the layer, and the like, the method in a given instance depending on the use to which the layer is to be put or the nature of the final image or copies desired. A particularly preferred use envisaged for the invention is for preparing positive working lithographic printing plates.

The invention will be further illustrated by the following examples, wherein parts and percentages are by weight unless otherwise noted.

EXAMPLE I

A coating composition was prepared containing the following ingredients:

| | |
|---|---|
| (a) Trichloroethylene ________________g__ | 10.8 |
| (b) Acetone ______________________ml__ | 1 |
| (c) Polyethylene glycol dimethacrylate (average molecular weight 736) ______________g__ | 1.2 |
| (d) Poly(methyl methacrylate) (inherent viscosity=1.0 for a solution of 0.25 g. polymer in 50 ml. chloroform as measured at 20° C. with a No. 50 Cannon-Fenske Viscometer) ____g__ | 1.2 |
| (e) 2,2′-bis(o-chlorophenyl) - 4,4,5,5′-tetrakis (m-methoxyphenyl)biimidazole ________g__ | 0.1 |
| (f) 5 - (p - dimethylaminobenzylidene)rhodanine ___________________________g__ | 0.00134 |

After thorough mixing, a portion of the photopolymerizable composition thus formed was coated by means of a doctor knife set at a clearance of 0.002 inch on a 0.002-inch-thick polyethylene terephthalate film. The coating was air-dried for 30 minutes to permit evaporation of solvent, and a sheet of 0.0005-inch-thick polyethylene terephthalate film was then applied by hand over the tacky coating surface. The dried, tacky photosensitive coating was approximately 0.0004 inch in thickness. The photosensitive layer prepared in this way was exposed both by transmission and reflex exposures.

Transmission exposures

The photosensitive layer was exposed to a 1000-watt Colortran® tungsten-iodine light source, at a distance of 54 inches, through a high contrast transparency which was in contact with the cover sheet; two exposures of quite different intensities were made. After exposures, the cover sheet was removed and the layer dusted with a green pigment toner which adhered to the tacky, unpolymerized portion, but not to the photopolymerized regions.

When the exposure was of short duration, about 30 seconds, and the source was modulated by a Kodak 1A Wratten filter (opaque to radiation below 310 nm., transparent above 380 nm., reduced intensity 310–380 nm.) a positive image was obtained on toning. However, exposure of about 3 minutes, in the absence of any filter, gave a negative image on toning.

The above results, exemplary of this invention, are interpreted as follows: The shorter exposure through the filter was obviously less intense (the filter decreasing intensities in the region where hexaarylbiimidazoles absorb), and merely resulted in photopolymerization as known in the art. That is, the transparent portions of the process transparency transmits radiation sufficient to induce photopolymerization in the photosensitive layer, while the opaque portions screen the layer from the radiation; thus, the screened portions remain tacky and, after removal of the cover sheet, will accept a toner. The result is a positive image since the toned (dark) areas correspond to the opaque areas of the process transparency.

The longer, unfiltered exposure was obviously more intense, and gave a negative image after toning. Thus, the high intensity radiation transmitted through the transparent portion of the transparency did not induce photopolymerizaion. Apparently, the hydrogen-door component, the rhodanine derivative, was deactivated.

The polymerization found under the opaque portions of the transparency probably resulted from scattered radiation of lesser intensity, but of intensity sufficient to induce photopolymerization.

Reflex exposures

The photosensitive layer was placed between the light source (Colortran®, at 54 inches, as above) and an opaque original (i.e., printed paper) with the cover sheet in contact with the opaque original. As above, subsequent to the exposures described below, the cover sheet was removed and the coating dusted with a green pigment toner.

As with the transmission exposures, a lower intensity exposure, about 15 seconds with a Kodak 1A Wratten filter inserted between the photosensitive layer and light source, gave a positive image. On the other hand, a high intensity exposure, about 3 minutes without any filter, gave a negative image.

EXAMPLE II

A coating composition was prepared containing the following ingredients:

| | |
|---|---|
| (a) Trichloroethylene ____g__ | 10.8 |
| (b) Methanol ____ml__ | 1 |
| (c) Polyethylene glycol dimethacrylate (average molecular weight 736) ____g__ | 1.2 |
| (d) Poly(methyl methacrylate) (inherent viscosity=1.0 for a solution of 0.25 g. polymer in 50 ml. chloroform as measured at 20° with a No. 50 Cannon-Fenske Viscometer) ____g__ | 1.2 |
| (e) 2,2' - bis(o - chlorophenyl) - 4,4',5,5' - tetrakis (m-methoxyphenyl)biimidazole ____g__ | 0.1 |
| (f) Rhodanine (2 - mercapto - 4 - hydroxythia azole) ____g__ | 0.01 |
| (g) 2,5-bis(p - diethylaminobenzylidene)cyclopentanone ____g__ | 0.001 |

A laminated, photosensitive element was then prepared from the above composition, as described in Example I. This element was then exposed for 2.5 minutes, through a $\sqrt{2}$ step tablet (Stouffer Graphic Arts), to the radiation source of Example I, also at a distance of 54 inches. Following exposure, the cover sheet was removed and the exposed surface dusted with a toner; the following results were obtained: steps 1–2, accepted toner; steps 3–5, rejected toner; steps 6–21, accepted toner. This result, i.e., acceptance of toner at low and high, but not at intermediate exposure intensities, indicates that the photopolymerizable composition will yield either positive or negative images, depending on exposure intensities.

EXAMPLE III

A coating composition was prepared containing the following components:

| | |
|---|---|
| (a) Trichloroethylene ____ml__ | 35 |
| (b) Polyethylene glycol dimethacrylate viscosity 11.5 cps. at 25° C. (average molecular weight=336) ____g__ | 4.14 |
| (c) Poly[methyl methacrylate/methacrylic acid] (90/10 mole ratio) (intrinsic viscosity=0.094 using methyl ethyl ketone as solvent) ____g__ | 5.06 |
| (d) 2,2'-bis(o-chlorophenyl) - 4,4',5,5' - tetrakis-(m-methoxyphenyl)biimidazole ____g__ | 0.736 |
| (e) Tris(p-dimethylaminophenyl)methane (leuco Crystal Violet) ____g__ | 0.003 |
| (f) Solvent Red No. 109 (C.I. 109) ____g__ | 0.0625 |
| (g) 2-ethoxyethanol ____ml__ | 5.6 |

Component (f) is first dissolved in component (g), then added to the solution of ingredients (a)–(e). After thorough mixing the above photosensitive solution was coated on 0.001-inch-thick polyethylene terephthalate film by means of a doctor knife set at a clearance of 0.003 inch. The coating was air dried for 30 minutes to permit evaporation of solvent; the dried coating weight was approximately 0.06 g./dm.$^2$. This layer was then laminated to grained, nontreated aluminum by means of a pressure nip (20 lbs./linear inch) between two rolls, one hard rubber and the other steel. The steel roll was heated to 150° C. and lamination was carried out at 6 ft./minute.

Three elements thus prepared were exposed from the clear side through a $\sqrt{2}$ step tablet (Stouffer Graphic Arts) with a 1000-watt quartz-iodine lamp (Colortran® Quartz-King, model No. 116–021) at a distance of 36 inches for one, two, and three minutes respectively. After removal of the polyethylene terephthalate cover sheet, the exposed plates were developed by washing out the unpolymerized portions of the coatings using a solution of the following composition:

| Component: | Amount |
|---|---|
| Distilled water ____ml__ | 750 |
| Diamond Chemical, Silicate of Soda Grade 34 ($3.85\ SiO_2$:1 $Na_2O$) ____g__ | 78 |
| 2-n-butoxyethanol ____ml__ | 60 |
| Triton® X–100 (10% polyethylene glycol alkyl phenyl ether in water) ____ml__ | 2 |
| Distilled water to make 1 liter. | |

(The pH was 11.0.)

For development, the above solution was poured onto the exposed plates, allowed to react for 30 seconds, and the images produced by gently sponging the entire surface of the plates with developer. The plates were then rinsed with fresh water, and the following results observed:

| Exposure time (minutes) | Steps imaged (photopolymerized) | Steps washed out (unpolymerized) |
|---|---|---|
| 1 | 7–12 | 1–6, 13–21 |
| 2 | 7–16 | 1–6, 17–21 |
| 3 | 7–18 | 1–6, 19–21 |

The photopolymerized regions were made readily visible by the presence of the red dye. However, identical results are found in the absence of the dye (Solvent Red C.I. 109).

As described earlier in the specification, the regions which had received the most intense radiation, since they passed through the least dense portions of the step wedge (steps 1–6), were not photopolymerized. The steps receiving moderate radiation, since they were screened by medium densities, did photopolymerize. The steps receiving the least intense radiation, since they were screened by the densest portions of the step wedge, were also not polymerized.

EXAMPLES IV–IX

A series of photosensitive plates were prepared, using the composition of Example III, but varying the amounts of monomer (b) and binder (c), resulting in photosensitive compositions of varying internal viscosities. The plates were exposed for two minutes to the lamp and through the step wedge described in the previous example, but at a distance of 22 inches, then developed as in Example III. The results obtained are summarized in Table I.

TABLE I

| Ex. | Percent monomer component (b) of Ex. III | Percent binder component (c) of Ex. III | Steps imaged (photopolymerized) | Steps washed out (unpolymerized) |
|---|---|---|---|---|
| IV | 34 | 58 | 2–16 | 1, 17–21 |
| V | 36 | 56 | 3–15 | 1–2, 16–21 |
| VI | 38 | 54 | 5–15 | 1–4, 16–21 |
| VII | 40 | 52 | 6–14 | 1–5, 15–21 |
| VIII | 42 | 50 | 7–13 | 1–6, 14–21 |
| IX | 44 | 48 | 9–13 | 1–8, 14–21 |

These results show that at 34% monomer, reversal is marginal and essentially a negative system results. As more monomer is added, the reversal latitude increases and polymerization speed (high step No.) decreases.

EXAMPLE X

Example VI was repeated, but at decreased and increased intensity exposures. Example VI gave photopolymer from steps 5–15 (10 steps), and wash out of the matrix from steps 1–4 and 16–21. On decreasing the light intensity on the Example VI formulation, wash out occurred from steps 1–3 and 14–21, photopolymerization from steps 3–13 (10 steps). With increased light intensity, the same no polymer/polymer/no polymer phenomenon occurred but shifted to higher step numbers than in Example VI.

Examples III–X demonstrate the important aspect of versatility of this invention. That is, to optimize a system, one determines what light source is desired, and then uses the concentration of monomer necessary for best overlap. These examples also indicate a general procedure for preparing positive working lithographic printing plates. The first step involves finding the response of the plate to the light source intended for use. A small strip of the plate is exposed 2–3 minutes to a Stouffer Step Tablet, the cover sheet removed, and the image developed as in Example III. If the sample washes out to step 6 and is solid to step 16 or below, then the light is optimized. If washout is below step 6 or more, then light intensity must be decreased or undercutting of the image will occur. If washout is only to step 3, there is possibility of scumming.

The information from the above result is sufficient to establish the platemaking conditions. The first intense exposure of 30–45 seconds imagewise, followed by an overall exposure at density corresponding to steps 10–15 for 3 minutes, yields a perfect plate. The plate cannot be overdeveloped by a developer as described in Example III.

If the light is adjusted so washout of a step tablet is as reported in Example III, it is impossible to overexpose the plate on the first exposure. At this intensity, any scattered light from whatever source, reflection from the aluminum, scatter in polyethylene terephthalate, etc., will be of low enough intensity to initiate polymerization, thereby forming walls around the image which will be the same size as the image. Subsequent irradiation at lower intensity will just continue the polymerization.

If the light source is too intense, and washout is down to step 10, it will be impossible to reproduce 2, 3 and 4% dots using a 150 line screen. The undercutting light will be intense enough to decompose the hydrogen-donor compound and eliminate possibility of polymerization.

If the light intensity is too low, then 45 seconds will not be enough to completely decompose initiator and partial polymerization will occur and give a scumming background.

EXAMPLES XI–XVII

The two-minute exposure conditions and development of Example III were repeated, with plates containing different monomers, component (b), of varying viscosities. The percentages of monomers necessary to give optimum results, i.e., washout from steps 0–5 or 6, polymer from steps 6–16, and washout above step 16, are reported in Table II.

TABLE II

| Ex. | Monomer | Optimum percentage[1] monomer | Viscosity at 20° C. (cps.) |
|---|---|---|---|
| III | Polyethylene gylcol dimethacrylate | 40 | 11.5 |
| XI | 1,6-hexanediol dimethacrylate | 35 | |
| XII | 1,6-hexanediol diacrylate | 40 | 36 |
| XIII | 1,10-decamethylene glycol diacrylate | 40 | |
| XIV | Triethylene glycol dimethacrylate | 45 | 7.5 |
| XV | Trimethylol propane trimethacrylate | 47 | 35 |
| XVI | Diethylene glycol diacrylate | 55 | 24 |
| XVII | Trimethylol propane triacrylate | 65 | 150 |

[1] The binder percentage equals [92% minus the percentage of monomer present].

These results indicate that the internal viscosity, not concentration, is an influential parameter since when the neat monomer has a high viscosity (Example XVII, 150 cps.), 60% gives optimum results whereas only 40% of a low viscosity monomer (Example III, 11.5 cps.) suffices. However, the polymethylene monomers (Examples XII, XIII) apparently follow a different sequence, requiring less monomer for a corresponding viscosity to yield optimum results. This may be due to improved plasticizer action by these monomers.

In order to obtain reverse imaging, the essence of this invention, the concentrations of the hexaarylbiimidazole and hydrogen-donor compound are critical, in addition to proper viscosity of the composition, as exemplified in Examples IV–XVII. The criticality of the hexaarylbiimidazole concentration is illustrated in Examples XVIII–XXII; the criticality of the hydrogen-donor compound's concentration is illustrated in Examples XXIII–XXVII.

EXAMPLES XVIII–XXII

A composition was prepared similar to Example III, exposed and developed as in Example III, but with varying concentrations of component (d). In this series of examples, the monomer component (b), binder component (c), and hydrogen-donor components (e) of Example III were present in 45, 55, and 0.03 parts by weight respectively. The results obtained are summarized in Table III.

TABLE III

| Ex. | Parts hexaarylbiimidazole[1] | Steps imaged (photopolymerized) | Steps washed out (unpolymerized) |
|---|---|---|---|
| XVIII | 1 | 1–8 | 9–21 |
| XIX | 2 | 5–10 | 1–4, 11–21 |
| XX | 3 | 6–11 | 1–5, 12–21 |
| XXI | 5 | 8–12 | 1–7, 13–21 |
| XXII | 6 | 9–12 | 1–8, 13–21 |

[1] (Component (d) of Ex. III) per 100 parts of components (b) and (c) combined.

The above data indicate that at a hexaarylbiimidazole concentration below 1–2% the photosensitive composition is a low speed, negative working system, as known in the art. From 2 to 6 or 7% hexaarylbiimidazole, however, the photosensitive system is positive working. Further work has shown that at a hexaarylbiimidazole concentration of 6–7% and above, only very small changes are found. That is to say, apparently, a saturation point has been reached.

EXAMPLES XXIII–XXVII

Examples XVIII–XXII were repeated, but in this series the hexaarylbiimidazole concentration (component (d) of Example III) was held constant at 4.0 parts per 100 parts of combined monomer plus binder while varying the hydrogen-donor compound concentration (component (e) of Example III). The results obtained are summarized in Table IV.

TABLE IV

| Ex. | Parts leuco crystal violet[1] | Steps imaged (photopolymerized) | Steps washed out (unpolymerized) |
|---|---|---|---|
| XXIII | 0.01 | 11–12 | 1–10, 13–21 |
| XXIV | 0.02 | 9–12 | 1–8, 13–21 |
| XXV | 0.04 | 5–12 | 1–4, 13–21 |
| XXVI | 0.05 | 3–12 | 1–2, 13–21 |
| XXVII | 0.06 | 1–12 | 13–21 |

[1] (Component (e) of Ex. III) per 100 parts of components (b) and (c) combined.

The preceding data indicate that under these experimental conditions, no reversal occurs with a concentration of hydrogen-donor compound (leuco Crystal Violet) above 0.05–0.06%; that is, the system is negative working. The data further indicate that changing the leuco Crystal Violet concentration gives a linear response by reciprocity behavior. Also, that the photospeed (i.e., highest step polymerized) is independent of leuco Crystal Violet concentration. Further, under the experimental conditions described, larger concentrations of leuco Crystal Violet lead only to a more intense visible image and do not increase photospeed.

EXAMPLE XXVIII

The laminated photosensitive element of Example III was imagewise exposed, through a process transparency using a 3750 watt pulsed xenon arc at a distance of 20 inches (nuArc® Platemaker FT–26–N), for 30 seconds. The transparency was then replaced by a neutral density filter having an optical density of 1.5, and the entire surface of the element exposed 3 minutes with the above lamp. Following these two exposures, the polyethylene terephthalate cover sheet was removed, and the image developed as in Example III.

On development, the areas exposed to the first, high intensity radiation, transmitted by the transparent portions of the process transparency, were washed out. The regions protected by the dark, opaque areas of the process transparency, did not receive the high intensity exposure. They did, however, receive the second, low intensity exposure, resulting in photopolymerization; the polymerized portions were insoluble in the developer solution. Thus, a positive relief photopolymer image that was a true copy of the process transparency was produced.

The plate so produced showed good ink/water characteristics, i.e., the photopolymerized areas readily accepted lipophilic inks while the areas of the support from which unpolymerized material had been removed accepted water readily. The plate ran satisfactorily on a wet offset press using a black printing ink and fountain solution to yield good positive copies of the original positive process transparency. The plates, further, resolved 2% highlight dots and 98% shadow dots at 150 line pairs/mm. Over 140,000 high quality impressions were made with no visible signs of wear; no special attention was given the plate during the run.

EXAMPLES XXIX–XXXII

Substantially identical results to Example XXVIII were obtained on substituting equal quantities of the monomers described in Examples XI–XIV into the composition, exposures, and development procedures described in Example XXVIII.

EXAMPLE XXXIII

The dried, photosensitive composition coated on polyethylene terephthalate film of Example III was laminated to a sheet of commercially available circuit board material comprising a 0.001-inch-thick coating of copper on a phenolic backing. The coated side was placed against the copper surface, such that the transparent substrate then became the protective top layer of the laminated structure. The element was then given an intense imagewise exposure through a positive transparency representing a printed circuit pattern. This intense exposure was for one minute at a distance of 20 inches to the (nuArc®) lamp described in Example XXVIII. The positive transparency was then removed and the element given an overall, low-intensity exposure (the filtered irradiation of Example XXVIII) for four minutes. After the cover sheet was removed and the layer given the solvent washout development of Example III, a positive relief photopolymer image of the circuit pattern remained.

A negative-working system, contrary to this invention, resulted from initially irradiating with the lower intensity source, then washing out unpolymerized portions with solvent.

This example demonstrates the ready application of this invention to a positive-working system for the production of printed circuits. After solvent wash-out as described, the board was etched by soaking 15 minutes at room temperature in a saturated solution of $FeCl_3$ in HCl to remove copper from areas not protected by the photohardened image, then water-rinsed. The photopolymer image was then removed by scrubbing with methylene chloride to reveal the remaining copper in the form of a circuit positively reproducing the pattern of the original process transparency.

From the foregoing, it will be seen that the present invention provides a positive-working, reverse-image photopolymer imaging system that has advantages in simplicity, convenience, economy and image quality over prior art methods of producing reverse images in photopolymers. The invention can be carried out with a wide variety of readily available and inexpensive materials, and it permits great flexibility in development or readout methods, such that, depending on the particular use, the final copies produced may be true or inverse copies of the original. The invention can find application in a variety of graphic arts and related manufacturing operations such as the production of relief or planographic printing plates, the making of positive proofs from positive transparencies, the preparation of reverse copies by thermal transfer and toning techniques, the manufacture of etched printed circuit boards, and the like.

I claim:

1. In a photosensitive composition consisting essentially of (A) a hydrogen- or electron-donor compound, (B) a hexaarylbiimidazole, (C) an ethylenically unsaturated compound capable of forming a high polymer by free radical initiated, chain propagating, addition polymerization, (D) an organic polymeric binder, the improvement wherein the concentrations of the components are, by weight, less than 0.4% (A), at least 1% (B), 30–70% (C), and 68–28% (D), with the ratio of (B)/(A) being 10/1 or greater, said composition being capable of yielding reverse images by photopolymerization.

2. The composition of claim 1 wherein the concentration of component (B) is at least 2% by weight.

3. The composition of claim 1 wherein the concentrations of the components are, by weight, 0.01–0.06% (A), 4–9% (B), 38–50% (C), and 53–38% (D).

4. A photosensitive element comprising a support bearing a stratum of the composition of claim 1.

5. A photosensitive element comprising an aluminum sheet bearing a layer of the composition of claim 3.

6. A photosensitive element comprising a polymeric film having a coating of the composition of claim 3.

References Cited

UNITED STATES PATENTS

| | | | |
|---|---|---|---|
| 3,380,825 | 4/1968 | Webers | 96—35.1 |
| 3,615,454 | 10/1971 | Cescon et al. | 96—35.1 |
| 3,479,185 | 11/1969 | Chambers et al. | 96—84 R |
| 3,556,794 | 1/1971 | Margerum | 96—45.2 |

NORMAN G. TORCHIN, Primary Examiner

E. C. KIMLIN, Assistant Examiner

U.S. Cl X.R.

96—87 R, 115 P; 250—65, 65.1; 204—159.22, 159.23